(12) United States Patent
Albou

(10) Patent No.: US 10,955,103 B2
(45) Date of Patent: Mar. 23, 2021

(54) LIGHT MODULE WITH LIGHT BEAM SCANNING, NOTABLY FOR MOTOR VEHICLES, PROVIDED WITH A FOCUSING SYSTEM HAVING SMALL DIMENSIONS, AND MOTOR VEHICLE LIGHT DEVICE COMPRISING SUCH A LIGHT MODULE

(71) Applicant: Valeo Vision, Bobigny (FR)

(72) Inventor: Pierre Albou, Bobigny (FR)

(73) Assignee: Valeo Vision, Bobigny (FR)

( * ) Notice: Subject to any disclaimer, the term of this patent is extended or adjusted under 35 U.S.C. 154(b) by 27 days.

(21) Appl. No.: 16/227,372

(22) Filed: Dec. 20, 2018

(65) Prior Publication Data

US 2019/0195452 A1 Jun. 27, 2019

(30) Foreign Application Priority Data

Dec. 22, 2017 (FR) ...................... 17 63178

(51) Int. Cl.
*F21S 41/00* (2018.01)
*F21S 41/27* (2018.01)
(Continued)

(52) U.S. Cl.
CPC ............ *F21S 41/27* (2018.01); *F21S 41/141* (2018.01); *F21S 41/16* (2018.01); *F21S 41/176* (2018.01);
(Continued)

(58) Field of Classification Search
CPC ........ F21S 41/27; F21S 41/675; F21S 41/176; F21S 41/16; F21S 43/40; F21S 43/16;
(Continued)

(56) References Cited

U.S. PATENT DOCUMENTS

| 2014/0226215 A1 | 8/2014 | Komatsu | |
| 2015/0176811 A1* | 6/2015 | Schwaiger | F21S 41/675 362/84 |

(Continued)

FOREIGN PATENT DOCUMENTS

| CN | 103984098 A | 8/2014 |
| EP | 2 963 476 A1 | 1/2016 |

(Continued)

OTHER PUBLICATIONS

French Preliminary Search Report dated Sep. 5, 2018 in French Application 17 63178 filed on Dec. 22, 2017 (with English Translation of Categories of Cited Documents).

(Continued)

*Primary Examiner* — Y M. Quach Lee
(74) *Attorney, Agent, or Firm* — Oblon, McClelland, Maier & Neustadt, L.L.P.

(57) ABSTRACT

A light module having light beam scanning, notably for motor vehicles, including a light source configured for generating a light beam which has a slow axis and a fast axis, a wavelength conversion element having a conversion surface, and scanning means arranged for scanning the conversion surface with the light beam, the light module including moreover a focussing system arranged for focussing the light beam onto the conversion element and for adapting the width of the light beam to the dimensions of the scanning means, the focussing system including a lens convergent along the fast and slow axes, the lens being provided with an input dioptre and an output dioptre of the light beam, the input dioptre being substantially cylindrical in such a way as to make the light beam converge only along the fast axis until inducing a point of inversion of the image of the light source inside the lens before the light beam reaches the output dioptre.

20 Claims, 2 Drawing Sheets

Figure 1:
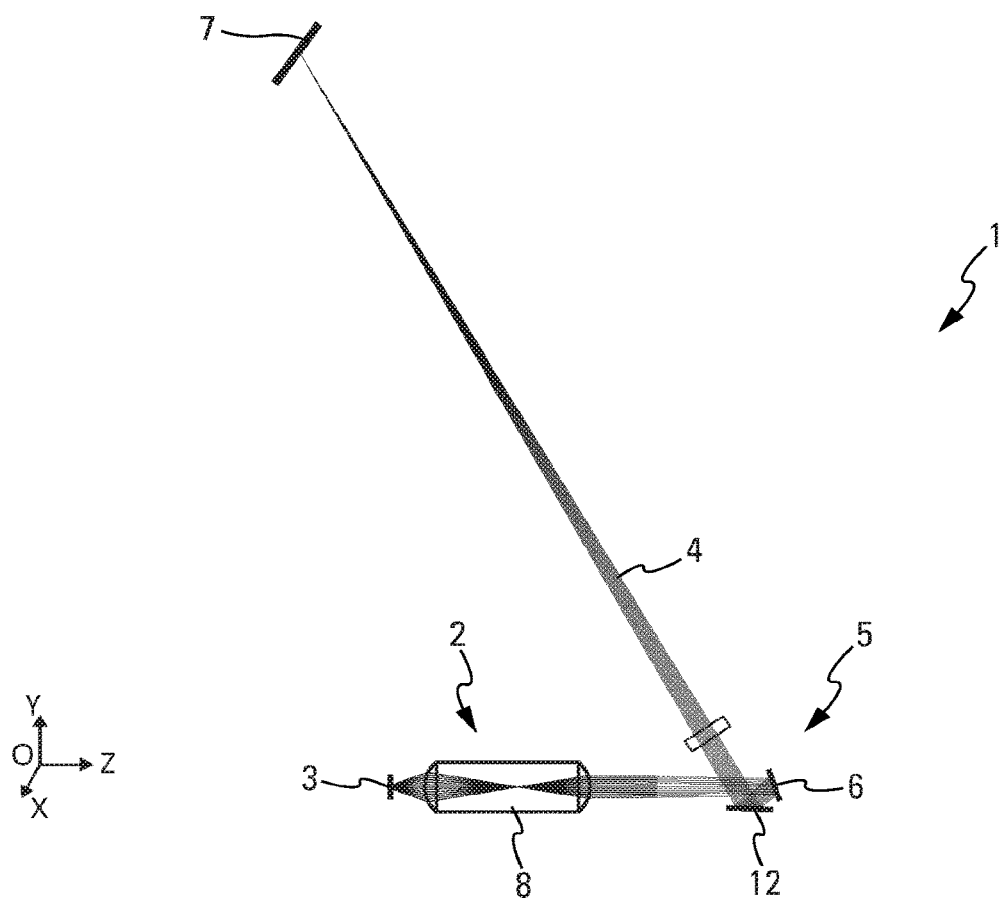

(51) Int. Cl.

| | |
|---|---|
| *F21S 41/176* | (2018.01) |
| *F21S 41/675* | (2018.01) |
| *F21S 41/16* | (2018.01) |
| *G02B 26/08* | (2006.01) |
| *F21S 43/16* | (2018.01) |
| *F21S 43/20* | (2018.01) |
| *F21S 43/40* | (2018.01) |
| *G02B 26/10* | (2006.01) |
| *G02B 3/00* | (2006.01) |
| *F21S 41/141* | (2018.01) |
| *F21Y 115/30* | (2016.01) |

(52) U.S. Cl.
CPC ............ *F21S 41/675* (2018.01); *F21S 43/16* (2018.01); *F21S 43/26* (2018.01); *F21S 43/40* (2018.01); *G02B 3/00* (2013.01); *G02B 26/0833* (2013.01); *G02B 26/101* (2013.01); *F21Y 2115/30* (2016.08)

(58) Field of Classification Search
CPC .......... F21S 41/141; F21S 43/26; G02B 3/00; G02B 19/0047; G02B 26/0833; G02B 26/101

See application file for complete search history.

(56) References Cited

U.S. PATENT DOCUMENTS

2016/0305626 A1* 10/2016 Tatara .................... F21S 41/16
2019/0093848 A1* 3/2019 Yagi ..................... F21S 41/176

FOREIGN PATENT DOCUMENTS

| EP | 3 203 305 A1 | 8/2017 |
| FR | 3047294 A1 | 8/2017 |

OTHER PUBLICATIONS

Chinese Office Action dated Oct. 29, 2020 in Chinese Patent Application No. 201811566525.6 w/English abstract, 11 pages.

* cited by examiner

LIGHT MODULE WITH LIGHT BEAM SCANNING, NOTABLY FOR MOTOR VEHICLES, PROVIDED WITH A FOCUSING SYSTEM HAVING SMALL DIMENSIONS, AND MOTOR VEHICLE LIGHT DEVICE COMPRISING SUCH A LIGHT MODULE

The present invention relates to a light module with light beam scanning, notably for motor vehicles, provided with a focussing system having small dimensions. The invention also relates to a motor vehicle light device comprising such a light module.

Motor vehicle headlamps are provided with one or more light modules arranged in a housing closed by an outer lens in such a way as to obtain one or more lighting and/or signalling beams at the output of the headlamp. The same thing applies to the rear lights. In a simplified manner, a light module of the housing notably comprises a light source, for example one (or several) light emitting diodes, which emits a light beam, an optical system for projecting the lighting and/or signalling beam comprising one or more lenses and, if necessary, an optical element, for example a reflector, for orienting the light rays coming from the light sources, in order to form the output light beam of the optical module.

In the motor vehicle industry, motor vehicle manufacturers and motor vehicle parts manufacturers are continually seeking to improve the performance and safety of vehicles by technical innovations. Thus, new technical elements which provide specific advantages are incorporated in these vehicles. For example, in the case of light modules for light devices of vehicles such as the headlamps or the rear lamps, there are laser diodes which can advantageously replace the light emitting diodes in order to produce the light beam which will be used to form the lighting and/or signalling output beam.

However, the usual laser beams have a colour which does not correspond to the regulation colours of such light devices. The light module therefore comprises a wavelength conversion element, which has a conversion surface. The conversion element receives the light beam from the laser source and converts a part of it, the assembly forming for example in white light, towards the optical projection system. Thus, the laser beam is not used directly for forming the lighting and/or signalling beam, but it is first projected onto the wavelength conversion element, which is for example of the phosphorescent and/or fluorescent type.

It should be noted that in the present application, the "light beam" concept includes the electromagnetic beams that are visible and invisible to the human eye.

Scanning means are necessary in order to illuminate a large area of the conversion element with the light beam from the laser source. The scanning by the beam is carried out from one edge to the other of area of the conversion element, and preferably at a frequency that is sufficiently high for the human eye not to perceive then movement and to see a continuous lighting of the lighting beam produced by the device. The scanning amplitude defines the movement of the light beam in space and therefore the size of the area of illumination on the conversion element.

The known scanning means are for example elements of the MEMS (standing for "Micro-Electro-Mechanical-Systems in English or electromechanical micro-systems) type comprising one or more micromirrors which reflect the laser beam onto the area. These micromirrors are for example driven with at least one rotational movement about an axis which generates the scanning of the area in a first direction. A second micromirror or another rotational movement of the first mirror about a second axis perpendicular to the first axis makes it possible to produce scanning in two directions.

The dimensions of these elements give rise to constraints in the disposition of each of them in the light module. In fact, the distance between the scanning means of the conversion element defines the size of the area scanned by the light beam, given that the scanning amplitude is dependent on the configuration of the scanning means. It is moreover sought to obtain a specific width of the laser on the conversion element, which is called the "target". The intersection of the light beam and the target is called the "spot" (which is the English term). Thus, the spot scans the area of the conversion element.

Moreover, for reasons of efficiency, it is desirable to illuminate the surface of the micromirror in a substantially complete manner, whilst preventing the beam from extending beyond the edges of the micromirror, at the risk of burning the other constituent elements of the scanning means and of wasting energy. Consequently, the light beam must be calibrated in order to adapt its width to the dimensions of the micromirrors. The expression "width of the light beam" is understood to mean the largest dimension of its intersection with the plane of the micromirror.

For this purpose, it is possible to use a system for focussing the light beam, comprising for example a convergent lens for modifying the dimensions of the light beam and adapting them to those of the micromirror or micromirrors.

On the other hand, certain laser beams very useful in industrial production, for example of the multimode type, are not "Gaussian", that is to say they generate a beam which cannot be modelled by a single Gaussian distribution. These lasers must be modelled by a surface source of substantially rectangular shape situated at the "waist" of the beam with a first axis along which the source is narrow and a second axis along which the source is wider, The term "waist" refers to the minimum dimension of the beam in a spot, the beam seeming to diverge starting from the said spot. It is also called the neck or the waist. Moreover, along the first axis, which is called "fast", the beam diverges more strongly than along the second axis, which is called "slow". In other words, the behaviour of the laser beam in the near field and in the distant field is not the same in both directions. Thus the width of the beam a greater in the direction of the slow axis than in the direction of the fast axis at the level of the light source.

Consequently, it is not possible to focus such a laser beam correctly with a conventional rotationally symmetrical lens in order to adapt it to the dimensions of the micromirror or micromirrors and to obtain a spot of the desired size on the conversion element.

In the continuation of the application, the expression "beam along the slow and/or along the fast axis" is understood to mean all of the components of the beam that are parallel with the slow axis and/or parallel with the fast axis respectively.

Moreover, there are light sources of the laser type which are inserted in housings and protected by a transparent outer lens in order to shield them from dust which could cause their malfunction. These protection means prevent the placing of another optical element, for example a focussing system, very close to the light source. Thus, the size of the beam at the level of the first dioptre of the optical element cannot be reduced as much as desired. Moreover, the size of the light beam cannot therefore be adapted to the dimensions of the micromirror whatever the relative positioning of the micromirror and the target may be with respect to the light source.

The purpose of the invention is to overcome this disadvantage and it aims to provide a light module, notably for lighting and/or signalling, having light beam scanning and provided with a focussing system capable of modifying the width of the light beam in such a way as to adapt it to the dimensions of the micromirror or micromirrors along the large axis and along the small axis, and which allows moreover the use of light sources provided with protection means.

For this purpose, the invention relates to a light device, notably for lighting, having light beam scanning, notably for motor vehicles, comprising a light source configured for generating a light beam which has a slow axis and a fast axis, a wavelength conversion element having a conversion surface, and scanning means arranged for scanning the conversion surface with the beam, the device comprising moreover a focussing system arranged for focussing the light beam onto the conversion element and for adapting the width of the light beam to the dimensions of the scanning means, the focussing system comprising a lens convergent along the fast and slow axes, the lens being provided with an input dioptre and an output dioptre of the light beam, the input dioptre being substantially cylindrical in such a way as to make the light beam converge only along the fast axis until inducing a point of inversion of the image of the light source inside the lens before reaching the output dioptre.

A conversion element comprises at least one luminescent material designed for absorbing at least a portion of at least an excitation light emitted by the light source and for converting at least a portion of the said absorbed excitation light into an emission light having a wavelength different from that of the excitation light. Preferably the luminescent material is chosen from among the following compounds: $Y_3Al_5O_{12}:Ce^{3+}$ (YAG), $(Sr,Ba)_2SiO_4:Eu^{2+}$, $Ca_x(Si,Al)_{12}(O,N)_{16}:EU^{2+}$.

Thus, the lens makes the entire light beam converge towards the scanning means, that is to say both along the fast axis and the slow axis. However, the substantially cylindrical input dioptre makes it possible to modify the width of the beam along the fast axis to a greater degree in order to be able to adapt the beam along the slow axis and the fast axis independently. As the input dioptre is cylindrical, it has an effect only along the fast axis of the beam, and little or none along the slow axis of the beam which will be focussed by the output dioptre alone.

According to an advantageous embodiment of the invention, the point of inversion is closer to the output dioptre than to the input dioptre.

Thus, the size of the light beam at the level of the output dioptre which makes the beam converge towards the spot can be adapted and notably made smaller than on the input surface constrained by the protection devices. In other words a light beam is obtained at the level of the output dioptre adapted to the position and to the size of the micromirror and to the position of the target.

According to different embodiments of the invention, which can be taken together or separately:
 the output dioptre is convergent along the slow and fast axes,
 the output dioptre has convex curvature, that is to say a positive optical power,
 the output dioptre has a biconical curve surface,
 the biconical curve surface has a first radius of curvature along the slow axis and a second radius of curvature along the fast axis,
 the first radius of curvature is larger than the second radius of curvature,
 the input dioptre has a convex curvature along the fast axis, that is to say a positive optical power,
 the input dioptre is convergent along the fast axis,
 the curvature of the input dioptre has a substantially cylindrical portion whose axis is substantially parallel with the slow axis,
 the input dioptre is substantially flat along the slow axis in order to avoid modifying the light beam in that direction,
The expression "substantially flat" is understood to mean that the intersection of the surface of this dioptre with a plane perpendicular to the fast axis, and therefore parallel with the slow axis, is substantially a straight segment.
 the lens is disposed in the optical path of the light beam between the light source and the scanning means,
 the lens is a thick lens,
The expression "thick lens" is understood to mean that the thickness of the lens is greater than or equal to the largest dimension of the input and output dioptres.
 the scanning means are provided with one or two mobile micromirrors configured for scanning the surface of the conversion element with the light beam in a first direction and/or in a second direction substantially perpendicular to the first direction,
 the light source comprises at least one semiconductor emitting element, notably a light emitting diode, preferably a laser diode,
 the light beam generated by the light source is a laser beam,
 the conversion element comprises at least one luminescent material,
 the luminescent material is phosphorescent and/or fluorescent,
 the luminescent material is present over substantially the whole of the surface of the conversion element.
The invention also relates to a motor vehicle light device comprising such a light module.

Preferably, it can comprise a projection system. The projection system can comprise for example a lens and/or a mirror.

Figure 2:
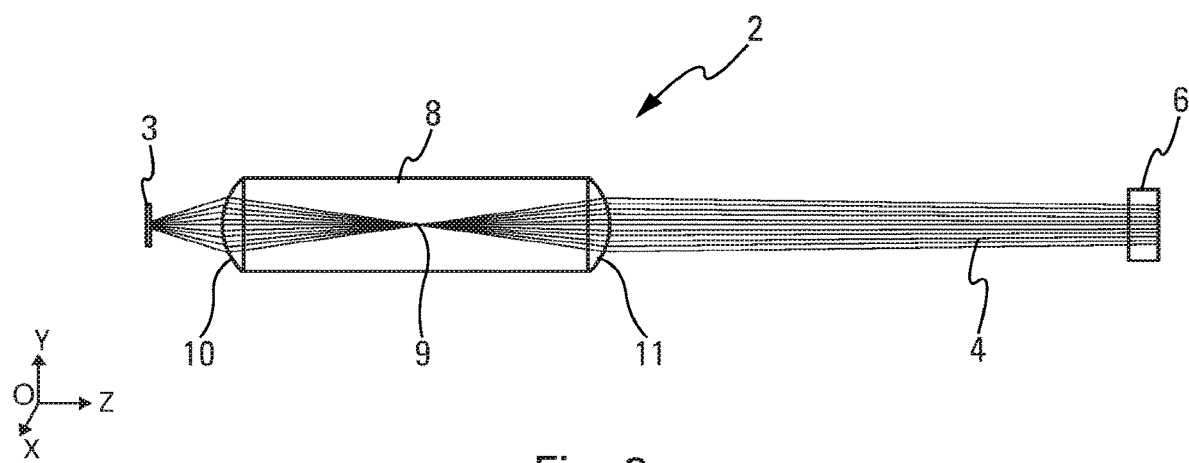
Figure 3:
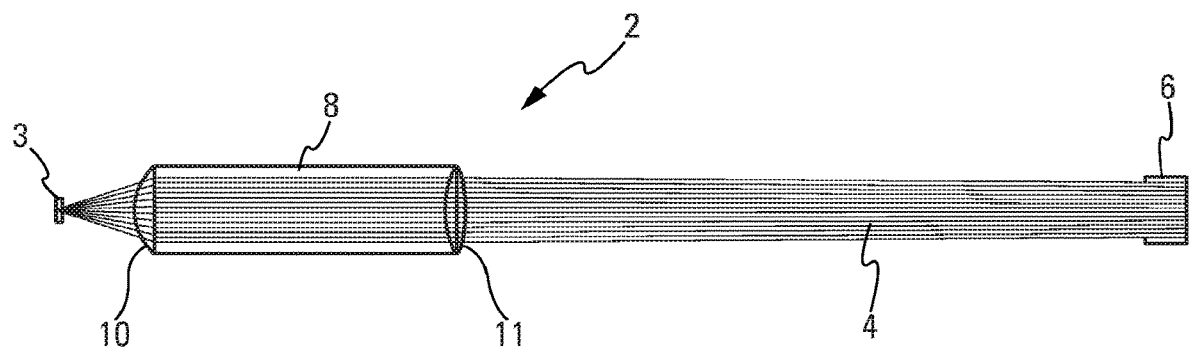
Figure 4:
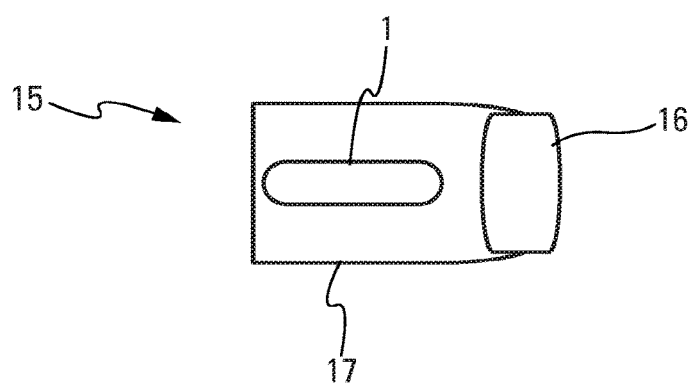

The invention will be better understood in the light of the following description which is given only by way of indication and which is not intended to limit it, accompanied by the appended drawings among which:

FIG. 1 shows in a diagrammatic manner a cross-sectional side view of a light module according to one embodiment of the invention, FIG. 2 shows in a diagrammatic manner a cross-sectional view through a plane containing the fast axis of the light source, FIG. 3 shows in a diagrammatic manner a cross-sectional view through a plane containing the slow axis of the light source, FIG. 4 shows in a diagrammatic manner a motor vehicle light device comprising a light module according to the invention.

As shown in FIG. 1, the light module 1, notably used in a light device, in a rear lamp and/or in a lighting device inside the motor vehicle, comprises a coherent light source 3 capable of generating a light beam 4 which has an axis of propagation along (Oz), a slow axis along (Ox) and a fast axis along (Oy). The three axes are perpendicular in pairs as shown by the reference system (Oxyz). The slow axis and the fast axis define the width of the light beam 4 in the plane (Oxy) of the light source, the axis of propagation being collinear with the light beam 4. The beam 4 has a rectangular shape in the plane (Oxy) at the level of the emission face of the light source, the dimension of this rectangle being smaller along the fast axis than along the slow axis. The source 3 in this case is a laser diode which generates a laser beam whose light waves have substantially the same wavelength value, for example 448 nm in order to obtain a blue colour.

The light module 1 also comprises a wavelength conversion element 7 having a photo-luminescent conversion surface configured for converting the wavelength of the light beam, for example by spreading the distribution of the light waves over wavelength values corresponding to different colours. Thus a beam is obtained in another colour, for example a white colour, from the initial light beam 4, due to the conversion element 7. The white light beam serves for example as a lighting beam in a light device of a motor vehicle. The white beam can therefore be obtained by the additive synthesis of a portion of the light emitted by the light source and from a portion of the light converted by the conversion element.

The light module 1 also comprises means 5 of scanning the surface of the conversion element 7 by the light beam 4. The scanning means 5 are elements of the MEMS (standing for "Micro-Electro-Mechanical-Systems" in English or electromechanical micro-systems) type, which in this case comprise two micromirrors 6, 12. The first micromirror 6 is disposed in the axis of propagation of the beam 4. The first micromirror 6 reflects the light beam 4 towards the second micromirror 12 which reflects it towards the conversion surface of the conversion element 7. These micromirrors 6, 12 are driven with a rotary movement about an axis which generates the scanning of the surface of the conversion element 7 each according to a direction. The scanning by the beam 4 is carried out over the totality of a chosen area on the conversion surface, at a frequency that is sufficiently high, for example 200 Hz, for the human eye not to perceive the movement and to see a continuous lighting of the light beam generated by the conversion element 7. The light module 1 can comprise a housing for protecting the assembly, the housing comprising a sheet of glass to allow the beam 4 to emerge.

The light module 1 comprises moreover a focussing system 2 disposed between the light source 3 and the scanning means 5 in order to focus the light beam 4, on the one hand on the scanning means 5 in such a way as to cover a large part of the micromirrors 6, 12 whilst avoiding extending beyond their surface, and in order to obtain a desired spot size on the conversion surface of the conversion element 7.

The scanning means 5, the conversion element 7 and the focussing system 2 are disposed in such a way that the light beam 4 generated by the light source 3 first encounters the scanning means 5 and then the conversion element 7.

According to the invention, the focussing system 2 comprises a convergent lens 8 provided with an input dioptre 10 and an output dioptre 11 for the light beam 4. The lens 8 is disposed in the optical path of the light beam between the light source and the scanning means 5. In other words, the light beam 4 generated by the light source 3 passes through the lens 8 before reaching the scanning means 5. The lens 8 is disposed such that it is coaxial with the optical axis of the light beam along the axis Oz, in such a way that the light beam 4 passes through the lens 8 whilst being substantially centred.

As shown in FIGS. 2 and 3, the lens 8 is configured to make the light beam 4 converge along the fast and sow axes. In particular, it is provided for adapting the width of the light beam 4 both along the fast axis and along the slow axis to the dimensions of the scanning means 5, in this case at the first mirror 6, and to the desired spot size on the conversion element.

For this purpose, the input dioptre 10 is substantially cylindrical so as to make the light beam 4 converge along the fast axis until it induces a point of inversion of the image of the light source 3 inside the lens 8 before the beam 4 reaches the output dioptre. In other words, The light beam 4 converges on the inversion point 9 only along the fast axis, the position of the edges of the beam inverting along the fast axis after the inversion point 9. The input dioptre 10 comprises a convex curvature having a substantially cylindrical portion whose axis is substantially parallel with the slow axis. The term "convex" signifies that the curvature of the input dioptre 10 bulges towards the outside of the lens and the expression "substantially cylindrical" signifies that the dioptre has a curvature exhibiting at least a portion of cylinder or close to a portion of cylinder. In this case it is a cylinder in the mathematical sense, that is to say the cross section of the cylinder is not necessarily circular. Thus, only the width of the light beam 4 along the fast axis is modified.

The input dioptre 10 of the lens 8 has a focal length that is sufficiently short for the inversion point 9 to be inside the lens 8, that is to say before the light beam passes through the output dioptre 11, and in such a way as to obtain a desired width on the output dioptre 11. The desired width along the fast axis is chosen as a function of the focal length of the output dioptre 11 and the dimensions of the scanning means 5 and their positioning with respect to the lens and to the conversion element 7. Thus, the image of the source 3 along the fast axis is inverted when the beam 4 reaches the output dioptre 11. The inversion as such has no consequence on the use of the light beam thereafter, because the image of the source has no particular significance here. On the other hand, due to the positioning of the point 9 of inversion of the image of the source as close as necessary to the output dioptre 11, the lens can be distanced further from the source 3 than is the case of a lens whose input dioptre does not invert the image. Thus the lens 8 makes it possible to use a laser source provided with protection means. The effect is related to the inversion but is not its consequence; what is important is the imaging at a finite distance inside the device or the existence of the convergence point 9.

Moreover, the width of the beam 4 along the slow axis is not modified by the input dioptre of the lens 8 because the input dioptre 10 is substantially flat along the slow axis, as shown in FIG. 3. Consequently, the input dioptre 10 of the lens 8 is provided with only a single curvature in order not to modify the size of the spot which will be adapted by the output dioptre 11.

The output dioptre 11 of the lens 8 is convergent along the slow and fast axes. For this purpose, the output dioptre 11 has a convex curvature. Moreover, the output dioptre 11 has a biconical curved surface. In other words, the surface of the output dioptre 11 has two radii of curvature, preferably a first one for the slow axis and a second one for the fast axis. Thus the convergence of the output dioptre 11 long each axis can be adapted separately.

Thus, as shown in FIG. 2, the lens 8 adapts the width of the light beam 4 along the fast axis to the dimensions of the micromirror 6 of the scanning means 5, thanks to the combination of the convergences induced by the input 10 and output 11 dioptres.

The lens 8 is moreover a thick lens such that the input dioptre 10 and the output dioptre 11 are sufficiently distant from each other. The term "thick" signifies that it is not a conventional thin lens. The thickness of the lens defines the distance between the output dioptre 11 and the input dioptre 10, such that the real image of the source 3 is placed with respect to the focal length of the output dioptre 11 in such a way as to obtain a correct adjustment of the width of the light beam along the fast axis. Along the slow axis, the dioptres 10 and 11 together constitute a plano-convex lens focussed on the source and the input dioptre source distance (chosen to be as short as possible taking into account the constraints imposed by the protection devices of the source), added to the thickness of the lens determine for the given lens target distance a magnification adjusted to obtain a spot of the desired size on the target.

Thanks to the invention, such a focussing system provided with a thick convergent lens 8, the input dioptre 10 of which is cylindrical along the fast axis makes it possible, on the one hand, to obtain a spot size conforming with what is desired on the conversion element 7 in all directions and, on the other hand, to obtain a section of the beam adapted to the scanning means 5.

FIG. 4 shows for example a motor vehicle light device 15 provided with a light module 1 such as described above, the device being incorporated in a housing 17. The light device 15 also comprises a projection system 16 configured for orienting the light beam outside of the lighting device 15. The projection system 16 is for example provided with a projection lens placed downstream of the light module 1 in order to transmit a beam intended to illuminate the road.

The invention claimed is:

1. A light module having light beam scanning, notably for motor vehicles, comprising:
   a light source configured for generating a light beam which has a slow axis and a fast axis,
   a wavelength conversion element having a conversion surface, and
   scanning device arranged for scanning the conversion surface with the light beam, and
   a focussing system arranged for focussing the light beam onto the conversion element and for adapting the width of the light beam to the dimensions of the scanning device, the focussing system comprising a lens convergent along the fast and slow axes, the lens being provided with an input dioptre and an output dioptre of the light beam, the input dioptre being substantially cylindrical in such a way as to make the light beam converge only along the fast axis until inducing a point of inversion of the image of the light source inside the lens before the beam reaches the output dioptre.

2. Light module according to claim 1, wherein the output dioptre is convergent along the slow and fast axes.

3. Light module according to claim 1, wherein input dioptre has a convex curvature along the fast axis, having a substantially cylindrical portion whose axis is substantially parallel with the slow axis.

4. Light module according to claim 1, wherein the lens is disposed in the optical path of the light beam between the light source and the scanning device.

5. Light module according to claim 1, wherein the lens is a thick lens.

6. Light module according to claim 1, wherein the scanning device are provided with one or two mobile micromirrors configured for scanning the conversion surface with the light beam in a first direction and/or in a second direction substantially perpendicular to the first direction.

7. Light module according to claim 1, wherein the light source comprises at least one laser diode, the light beam generated being a laser beam.

8. Light module according to a claim 1, wherein the conversion element comprises a phosphorescent material.

9. Motor vehicle light device comprising a light module having light beam scanning according to claim 1.

10. Motor vehicle light device according to claim 9, further comprising a projection system.

11. Light module according to claim 2, wherein input dioptre has a convex curvature along the fast axis, having a substantially cylindrical portion whose axis is substantially parallel with the slow axis.

12. Light module according to claim 2, wherein the input dioptre is substantially flat along the slow axis in order to avoid modifying the light beam in that direction.

13. Light module according to claim 2, wherein the lens is disposed in the optical path of the light beam between the light source and the scanning device.

14. Light module according to claim 2, wherein the lens is a thick lens.

15. Light module according to claim 2, wherein the scanning device is provided with one or two mobile micromirrors configured for scanning the conversion surface with the light beam in a first direction and/or in a second direction substantially perpendicular to the first direction.

16. Light module according to claim 2, wherein the light source comprises at least one laser diode, the light beam generated being a laser beam.

17. Light module according to a claim 2, wherein the conversion element comprises a phosphorescent material.

18. Motor vehicle light device comprising a light module having light beam scanning according to claim 2.

19. Light module having light beam scanning, for motor vehicles, comprising:
   a light source configured for generating a light beam which has a slow axis and a fast axis,
   a wavelength conversion element having a conversion surface, and
   scanning device arranged for scanning the conversion surface with the light beam, and
   a focussing system arranged for focussing the light beam onto the conversion element and for adapting the width of the light beam to the dimensions of the scanning device, the focussing system comprising a lens convergent along the fast and slow axes, the lens being provided with an input dioptre and an output dioptre of the light beam, the input dioptre being substantially cylindrical in such a way as to make the light beam converge only along the fast axis until inducing a point of inversion of the image of the light source inside the lens before the beam reaches the output diopter, wherein:
   the output dioptre is convergent along the slow and fast axes, and
   the output dioptre has a biconical curve surface.

20. Light module having light beam scanning, for motor vehicles, comprising:
   a light source configured for generating a light beam which has a slow axis and a fast axis,
   a wavelength conversion element having a conversion surface, and
   scanning device arranged for scanning the conversion surface with the light beam, and
   a focussing system arranged for focussing the light beam onto the conversion element and for adapting the width of the light beam to the dimensions of the scanning device, the focussing system comprising a lens convergent along the fast and slow axes, the lens being provided with an input dioptre and an output dioptre of the light beam, the input dioptre being substantially cylindrical in such a way as to make the light beam converge only along the fast axis until inducing a point of inversion of the image of the light source inside the lens before the beam reaches the output diopter, wherein the input dioptre is substantially flat along the slow axis in order to avoid modifying the light beam in that direction.

* * * * *